United States Patent
Kuo

(10) Patent No.: US 7,732,256 B2
(45) Date of Patent: Jun. 8, 2010

(54) FABRICATION METHOD OF NON-VOLATILE MEMORY

(75) Inventor: Ming-Chang Kuo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 203 days.

(21) Appl. No.: 11/614,086

(22) Filed: Dec. 21, 2006

(65) Prior Publication Data
US 2007/0092997 A1    Apr. 26, 2007

Related U.S. Application Data

(62) Division of application No. 11/160,741, filed on Jul. 7, 2005, now Pat. No. 7,170,129.

(30) Foreign Application Priority Data
Apr. 26, 2005    (TW) .................................. 94113185

(51) Int. Cl.
*H01L 21/48* (2006.01)
*H01L 21/50* (2006.01)
*H01L 21/336* (2006.01)
*H01L 21/331* (2006.01)

(52) U.S. Cl. ................. 438/109; 438/257; 438/300; 438/350

(58) Field of Classification Search ............. 438/393, 438/109, 257, 300, 350; 257/317, 314
See application file for complete search history.

(56) References Cited

U.S. PATENT DOCUMENTS

| | | | |
|---|---|---|---|
| 6,255,166 B1 * | 7/2001 | Ogura et al. | 438/257 |
| 6,316,326 B1 * | 11/2001 | Kao et al. | 438/393 |
| 6,825,523 B2 * | 11/2004 | Caprara et al. | 257/314 |
| 7,045,854 B2 * | 5/2006 | Osabe et al. | 257/317 |
| 2004/0256657 A1 * | 12/2004 | Hung et al. | 257/315 |

* cited by examiner

*Primary Examiner*—William M. Brewster
(74) *Attorney, Agent, or Firm*—Jianq Chyun IP Office

(57) ABSTRACT

A method of fabrication a non-volatile memory is provided. A stacked structure is formed on a substrate, the stacked structure including a gate dielectric layer and a control gate. Then, a first dielectric layer, a second dielectric layer and a third dielectric layer are respectively formed on the top and sidewalls of the stacked structure and the exposed substrate. Thereafter, a pair of charge storage layers are formed over the substrate to respectively cover a portion of the top and sidewalls of the stacked structure, and a gap exists between each of the charge storage layers.

5 Claims, 17 Drawing Sheets

FABRICATION METHOD OF NON-VOLATILE MEMORY

CROSS-REFERENCE TO RELATED APPLICATION

This is a divisional application of patent application Ser. No. 11/160,741, filed on Jul. 7, 2005, which claims the priority benefit of Taiwan patent application serial no. 94113185, filed Apr. 26, 2005 and is now allowed. The entirety of each of the above-mentioned patent applications is hereby incorporated by reference herein and made a part of this specification.

BACKGROUND OF THE INVENTION

1. Field of the Invention

This invention generally relates to a fabrication method of a memory element, and more particularly to a fabrication method of a non-volatile memory.

2. Description of Related Art

The non-volatile memory can save, read and erase data for multiple times, and the saved information can be retained even after power supply is off. With such advantages, the non-volatile memory has become a widely utilized element in personal computers and electronic devices.

A typical non-volatile memory element comprises a floating gate and a control gate thereon, made of doped polycrystalline silicon. Further, the floating gate and the control gate are isolated by an inter-gate dielectric layer, and the floating gate and the substrate are isolated by a tunneling layer. Besides, a source region and drain region are further disposed in the substrate at two sides of the control gate.

When writing data in a memory, a bias voltage is applied to the control gate, the source region and the drain region, for injecting electrons into the floating gate. When reading the data from the memory, an operational voltage is applied to the control gate. Meanwhile the charged electrons representing the state of the floating gate can affect the switch-on and the switch-off of the channel under the floating gate, which is utilized as a reference to determine the information value as "0" or "1". When erasing the information at the memory, the relative electric potentials of the substrate, the source region, the drain region or the control gate are increased, such that the electrons, in a tunneling effect, could go from the floating gate to the tunneling layer and exit to the substrate (a substrate erase process), or pass through the inter gate dielectric layer and exit to the control gate.

SUMMARY OF THE INVENTION

Accordingly, an object of the present invention is to provide a fabrication method of a non-volatile memory, for simplifying the process and therefore reducing the cost.

Another object of the present invention- is to provide a non-volatile memory, for increasing the integrating level, of the element, and the non-volatile memory can be utilized as multi-level memories.

Another object of the present invention is to provide an operation method of a non-volatile memory, for decreasing the voltage required by the control gate.

Another object of the present invention is to provide another operation method of a non-volatile memory, for decreasing the voltage required by the control gate.

The present invention provides a fabrication method of a non-volatile memory, wherein first a stacked structure is formed on a substrate, the stacked structure comprising a gate dielectric layer at the bottom and a control gate above it. Further, a first dielectric layer, a second dielectric layer and a third dielectric layer are respectively formed on the top and sidewalls of the stacked structure and over the exposed substrate. Furthermore, a pair of charge storage layers are formed over the substrate respectively to cover a portion of top and sidewalls of the stacked structure, wherein a first gap exists between each charge storage layer.

According to the non-volatile memory fabrication method of the embodiments of the present invention, when forming the above-mentioned charge storage layers, the method further includes forming a pair of assist gates over the substrate on two sides of the pair of charge storage layers, wherein a second gap exists between each of the assist gates and each of the charge storage layers.

According to the non-volatile memory fabrication method of the embodiments of the present invention, the method further includes respectively forming a source region and a drain region in the substrate on two sides of the pair of charge storage layers.

The present invention provides a non-volatile memory, including a substrate, a stacked structure, a pair of charge storage layers, a first dielectric layer, a second dielectric layer and a third dielectric layer. Wherein, the stacked structure is disposed over the substrate, the stacked structure comprising a gate dielectric layer at the bottom and a control gate above it. The pair of charge storage layers respectively covers a portion of the top and sidewalls of the stacked structure, and a first gap exists between each charge storage layer. The first dielectric layer is disposed between the top of the stacked structure and each of the charge storage layers. The second dielectric layer is disposed between the sidewall of the stacked structure and each of the charge storage layers. The third dielectric layer is disposed between each of the charge storage layers and the substrate.

The non-volatile memory of the embodiments of the present invention further includes a pair of assist gates and a fourth dielectric layer. Wherein, the assist gates are disposed over the substrate on two sides of the pair of charge storage layers, and retain separated from each of the charge storage layers by a second gap. The fourth dielectric layer is disposed between each of the assist gates and the substrate.

The non-volatile memory of the embodiments of the present invention further includes a source region and a drain region, respectively disposed in the substrate on two sides of the pair of charge storage layers.

The present invention provides a non-volatile memory operation method, which is adapted for a non-volatile memory, wherein the non-volatile memory at least comprises a control gate over a substrate, a first charge storage layer and a second charge storage layer which respectively covers a portion of the top and sidewalls of the control gate, and a first assist gate and a second assist gate which are disposed at the two sides of the control gate and separated from each of the charge storage layers by a gap. Wherein the operation method comprises: when programming a first bit, a first voltage is applied on the control gate, a second voltage is applied on the first assist gate for forming a drain inversion region at the substrate below the first assist gate, a third voltage is applied on the drain inversion region, and the second assist gate is set as floating state, wherein the voltage values from low to high sequentially are the third voltage, the second voltage and the first voltage, so that the electrons go from the drain inversion region into the first charge storage layer by a FN tunneling effect. When programming a second bit, the first voltage is applied on the control gate, the second voltage is applied on the second assist gate for forming a source inversion region at the substrate below the second assist gate, the third voltage is applied on the source inversion region, and the first assist gate is set as floating state, so that the electrons go from the source inversion region into the second charge storage layer by the FN tunneling effect.

The present invention provides a non-volatile memory operation method, adapted for a non-volatile memory, wherein the non-volatile memory at least comprises a control gate over a substrate, a first charge storage layer and a second charge storage layer which respectively covers a portion of the top and the sidewalls of the control gate, a source region and a drain region which are respectively disposed in the substrate at the two sides of the second charge storage layer and the first charge storage layer. The operation method comprises: when programming a first bit, a fifteenth voltage is applied on the control gate, a sixteenth voltage is applied on the drain region, and the source region is set as a floating state, wherein the voltage values from low to high sequentially are the sixteenth voltage and the fifteenth voltage, so that the electrons go from the drain region into the first charge storage layer by the FN tunneling effect. When programming a second bit, the fifteenth voltage is applied on the control gate, the sixteenth voltage is applied on the source region, and the drain region is set as floating state, so that the electrons go from the source region into the second charge storage layer by the FN tunneling effect.

Because the charge storage layer is disposed over the control gate, the over-erase problem during the memory erasing process can be resolved, thereby enhancing the reliability of the element. Further, because the distance between the control gate and the substrate is closer, the voltage required by the control gate can be decreased. Furthermore, the present invention has two charge storage layers which are isolated from each other, and can be utilized as a multi-level memory.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

FIGS. 1A to 1D are cross-sectional views of a non-volatile memory fabrication process according to an embodiment of the present invention.

Figure 1A:
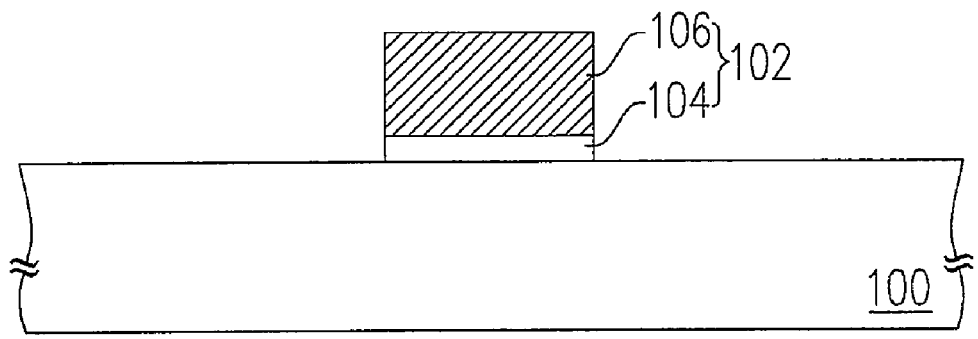
FIGS. 1A to 1D are cross-sectional views of a non-volatile memory fabrication process according to an embodiment of the present invention.

As shown in FIG. 1A, a stacked structure 102 is formed on a substrate 100, the stacked structure 102 comprising a gate dielectric layer 104 at the bottom and a control gate 106 above it. In the embodiment of the present invention, the gate dielectric layer 104 can be a single level dielectric layer, such as a silicon oxide layer. In another embodiment of the present invention, the gate dielectric layer 104 can be a multiple dielectric stacked layer, such as a silicon oxide/ silicon nitride/ silicon oxide stacked layer. Besides, the material of the control gate 106 can be polycrystalline silicon, doped polycrystalline silicon or other applicable conductive materials, for example.

Figure 1B:
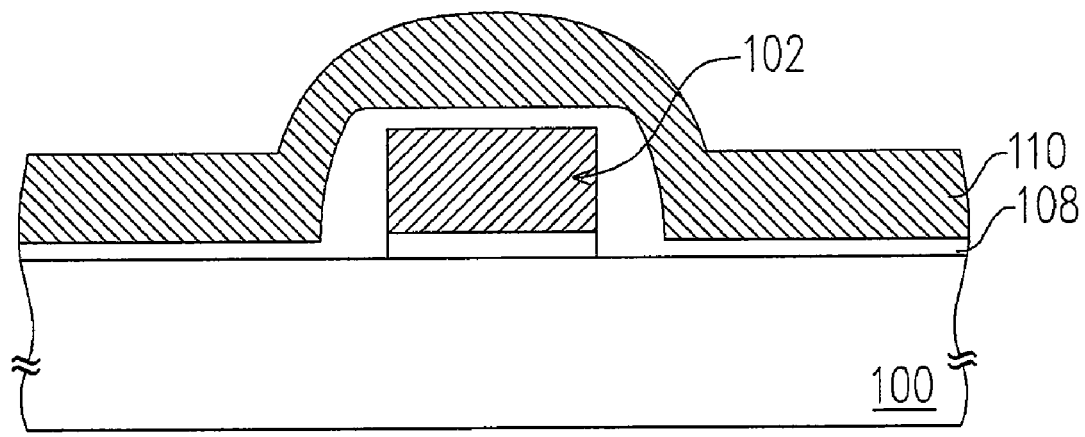

Thereafter, as shown in FIG. 1B, a dielectric material layer 108 is formed over the substrate 100, which covers the stacked structure 102 and the substrate 100. The material of the dielectric material layer 108 can be silicon oxide or other applicable materials, for example and the method of forming the dielectric material layer 108 can be a thermal oxidation process, a chemical vaporization deposition (CVD) process or other applicable methods.

Further, a conductive material layer 110 is formed over the substrate 100. The material of the conductive material layer 110 can be polycrystalline silicon, doped polycrystalline silicon or other applicable conductive materials, for example, and the conductive material layer 110 can be formed in a CVD process.

Figure 1C:
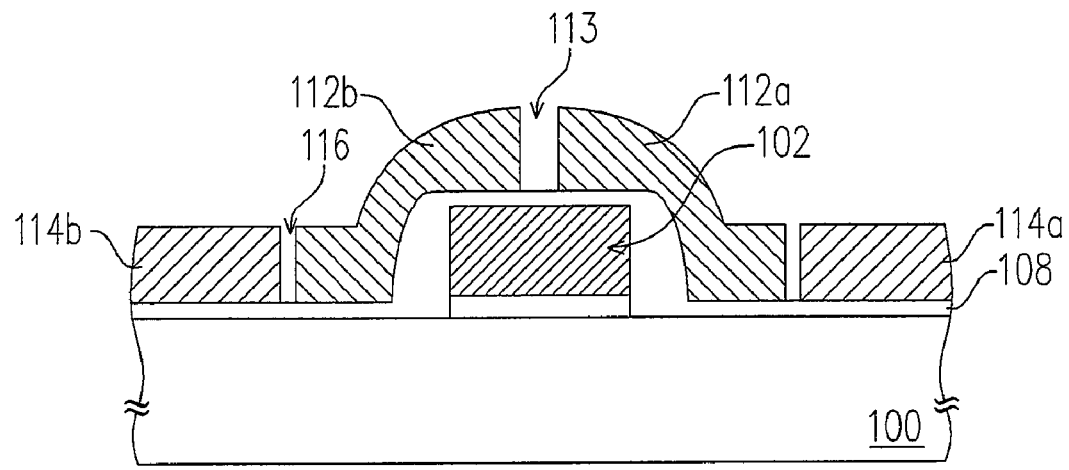

Further, as shown in FIG. 1C, the conductive material layer 110 is defined, for forming a pair of charge storage layers 112a and 112b over the substrate 100, which cover a portion of top and sidewalls of the stacked structure 102, and a gap 113 exists between the charge storage layers 112a and 112b. Further, a pair of assist gates 114a and 114b are formed over the substrate 100 on two sides of the pair of charge storage layers 112a and 112b, wherein a gap 116 exists between the assist gates 114a and 114b and the charge storage layers 112a and 112b.

Note that the material of the above-mentioned charge storage layers 112a and 112b is not limited to conductive materials, it can also be high dielectric constant materials, such as silicon nitride or aluminum oxide, which can be utilized for storing charges. When the material of the charge storage layers 112a and 112b is the high dielectric constant materials, the fabrication process of the charge storage layers 112a and 112b and the assist gates 114a and 114b must be performed in different steps. That is, the charge storage layers 112a and 112b and the assist gates 114a and 114b must be respectively defined by different photo mask fabrication processes.

Figure 1D:
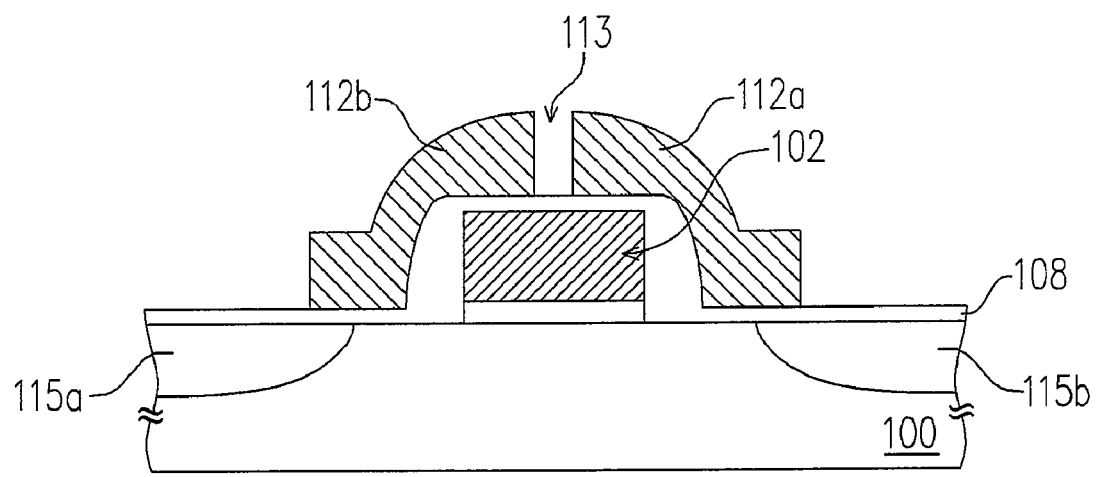

Further, in another embodiment of the present invention, only the charge storage layers 112a and 112b are defined in FIG. 1C, as shown in FIG. 1D. After the charge storage layers 112a and 112b are formed, a source region 115a and a drain region 115b are respectively formed over the substrate 100 on two sides of the charge storage layers 112a and 112b, for forming another memory of the present invention. Wherein, the source region 115a and the drain region 115b are formed by performing an ion implanting fabrication process by using the stacked structure 102 and the charge storage layers 112a and 112b as a mask.

Note that the dielectric material layer 108 disposed between the top of the stacked structure 102 and the charge storage layers 112a and 112b can be utilized as an inter gate dielectric layer, the dielectric material layer 108 disposed on the surface of the substrate 100 can be utilized as a tunneling layer, and the dielectric material layer 108 disposed between the sidewall of the stacked structure 102 and the charge storage layers 112a and 112b can be utilized as an isolating spacer. Further, the amount of film layers of the dielectric material layer, which is utilized as the inter gate dielectric layer or the isolating spacer, is not limited to one, but can also be a multiple dielectric stacked layer. This is discussed in the following two embodiments.

Figure 2A:
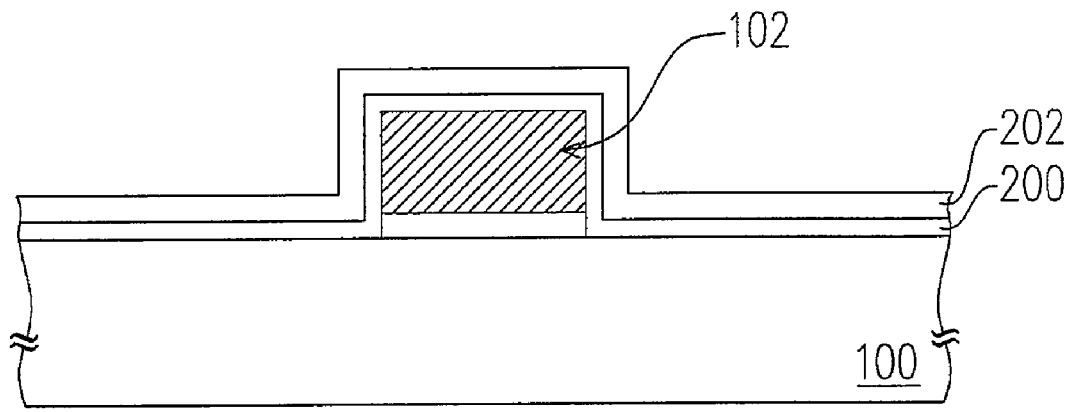
FIGS. 2A to 2D are cross-sectional views of a non-volatile memory fabrication process according to another embodiment of the present invention.
Figure 2B:
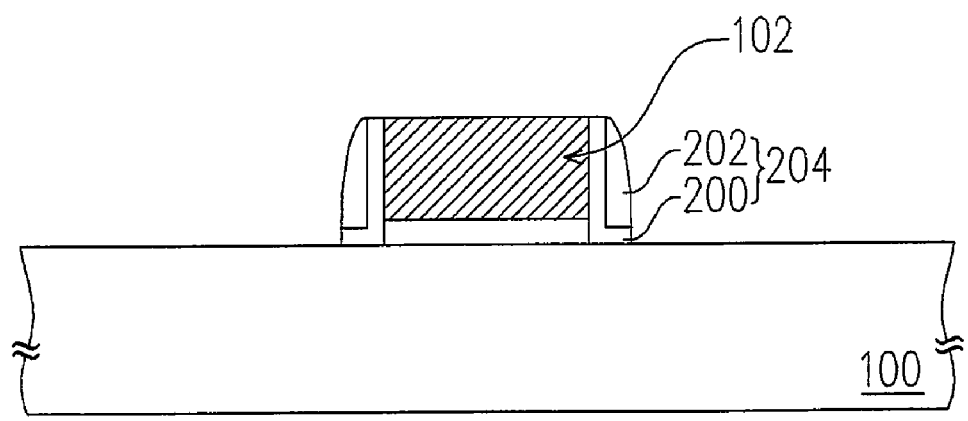
Figure 2C:
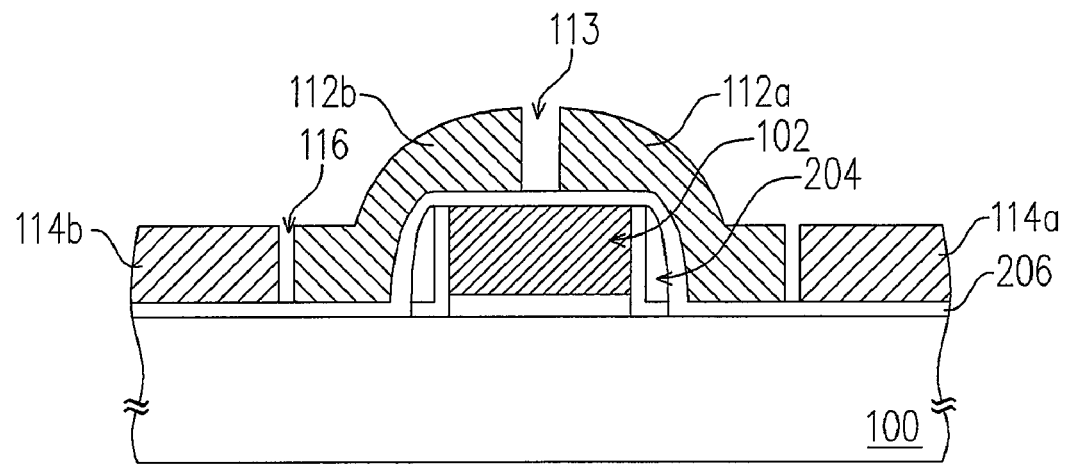
Figure 2D:
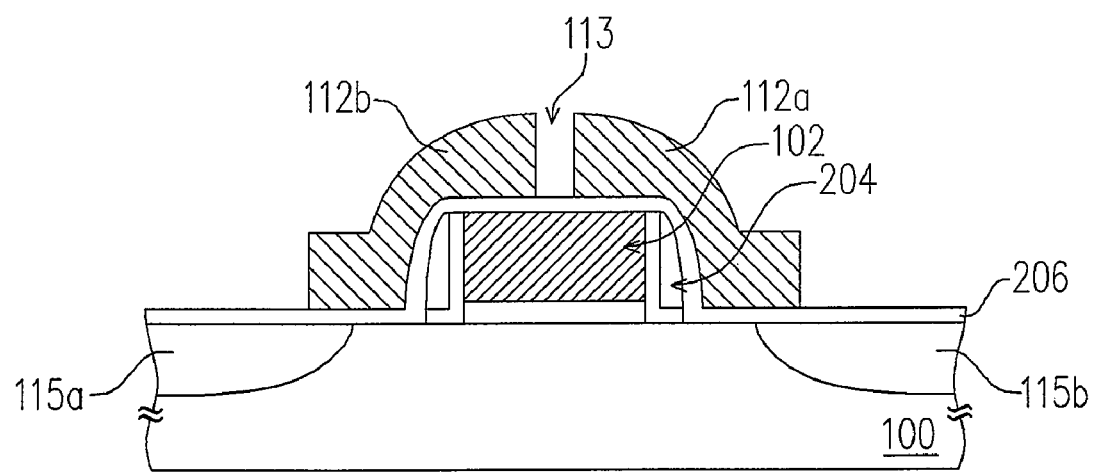

In the embodiment of the present invention, the dielectric material layer of the isolating spacer is a multiple dielectric stacked layer, for example. As shown in FIG. 2A, after a stacked structure 102 is formed over a substrate 100, dielectric layers 200 and 202 are formed over the substrate 100, covering the stacked structure 102 and the substrate 100. Wherein, the material of the dielectric material layer 200 for example is silicon oxide, the material of the dielectric material layer 202 for example is silicon nitride. Further, as shown in FIG. 2B, a portion of the dielectric layers 200 and 202 is removed, for forming a pair of composite dielectric spacers 204 on the sidewall of the stacked structure 102, while the top of the stacked structure 102 is exposed. Further, as shown in FIG. 2C, a dielectric material layer 206 is formed over the substrate 100, covering the stacked structure 102, the composite dielectric spacers 204 and the substrate 100. Wherein, the material of the dielectric material layer 206 for example is silicon oxide. Further, charge storage layers 112a and 112b are formed on a portion of the top and sidewalls of the stacked structure 102, and a pair of assist gates 114a and 114b are formed over the substrate 100 on two sides of the charge storage layers 112a and 112b. Or, in another embodiment, as shown in FIG. 2D, a source region 115a and a drain region 115b are respectively formed over the substrate 100 on the two sides of the charge storage layers 112a and 112b.

Figure 3A:
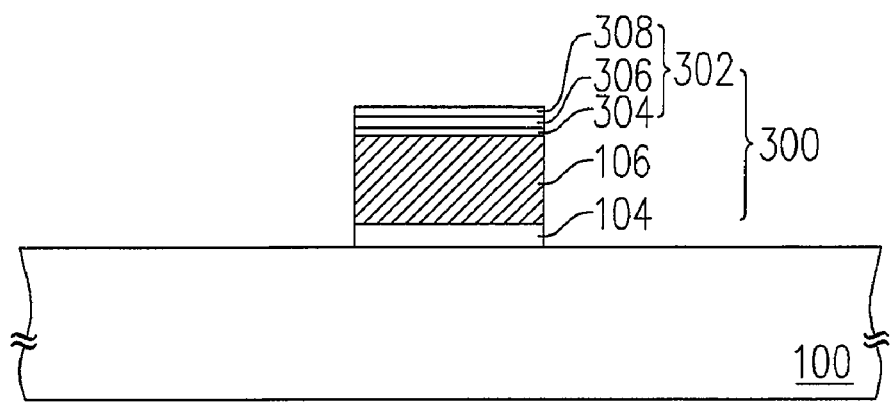
FIGS. 3A to 3E are cross-sectional views of a non-volatile memory fabrication process according to still another embodiment of the present invention.
Figure 3B:
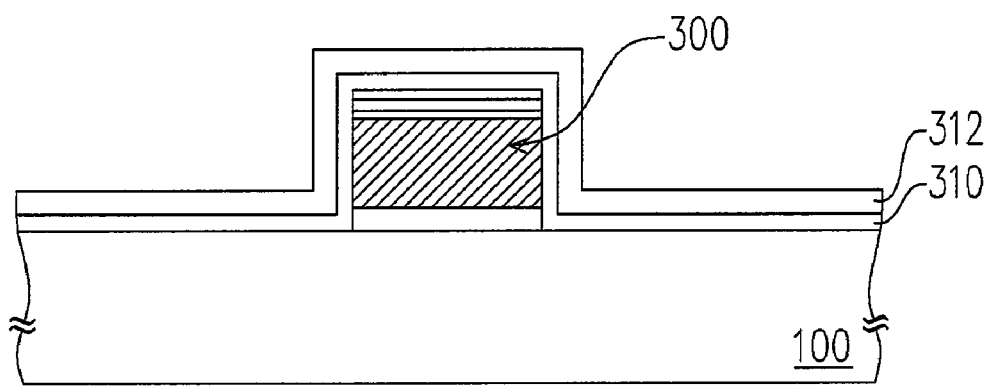
Figure 3C:
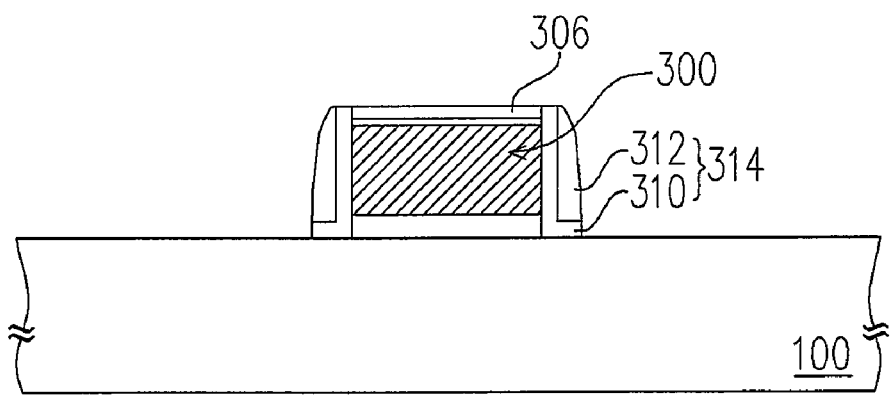
Figure 3D:
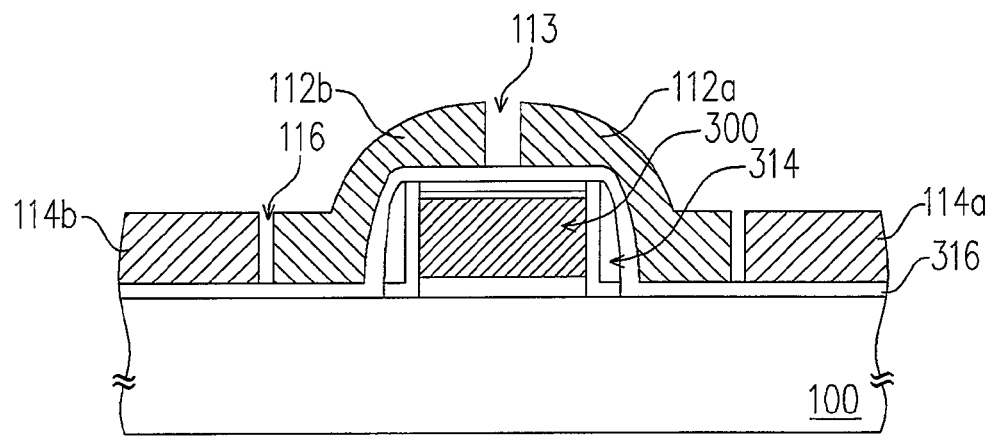
Figure 3E:
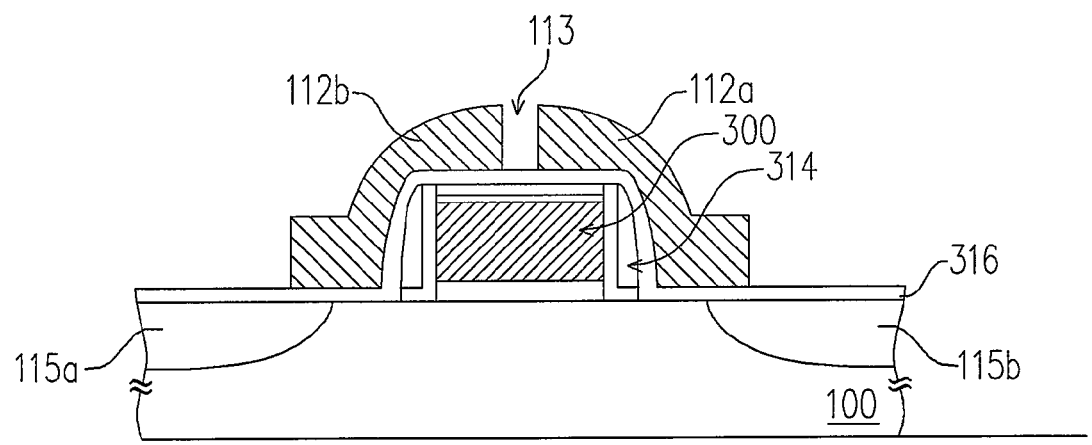

In another embodiment, all the dielectric material layers of the inter gate dielectric layer and the isolating spacer are multiple dielectric stacked layers, for example. As shown in FIG. 3A, a stacked structure 300 is formed over the substrate 100, the stacked structure 300 comprises a gate dielectric layer 104, a control gate 106 and dielectric stacked layers 302 sequentially over the substrate 100. Wherein, the dielectric stacked layers 302 are stacked layers of silicon oxide layer 304/silicon nitride layer 306/silicon oxide layer 308, for example. Further, as shown in FIG. 3B, dielectric material layers 310 and 312 are formed over the substrate 100, covering the stacked structure 300 and the substrate 100. Wherein, the material of the dielectric material layer 310 is silicon oxide, for example, and the material of the dielectric material layer 312 is silicon nitride, for example. Further, as shown in FIG. 3C, a portion of the dielectric layers 310 and 312 is removed, for forming a pair of composite dielectric spacers 314 on the sidewall of the stacked structure 300, while the top of the silicon nitride layer 306 in the stacked structure 300 is exposed. Further, as shown in FIG. 3D, a dielectric material layer 316 is formed over the substrate 100, covering the stacked structure 300, the composite dielectric spacers 314 and the substrate 100. Wherein, the material of the dielectric material layer 316 is silicon oxide, for example. Further, charge storage layers 112a and 112b are formed on a portion of the top and sidewalls of the stacked structure 300, and a pair of assist gates 114a and 114b are formed over the substrate 100 on the two sides the charge storage layers 112a and 112b. Alternatively, in another embodiment as shown in FIG. 3E, a source region 115a and a drain region 115b are respectively formed over the substrate 100 on the two sides of the charge storage layers 112a and 112b.

A structure of the non-volatile memory of the present invention is discussed in the following.

Figure 4A:
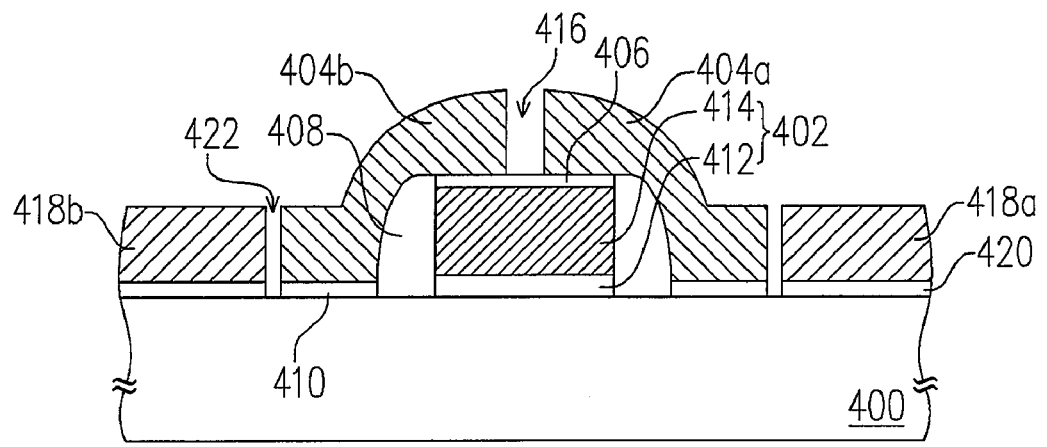
FIG. 4A is a cross-sectional view of a non-volatile memory according to an embodiment of the present invention.

As shown in FIG. 4A, the non-volatile memory of the present invention comprises a substrate 400, a stacked structure 402, a pair of charge storage layers 404a and 404b, and dielectric layers 406, 408, 410.

Wherein, the stacked structure 402 is disposed over the substrate 400, the stacked structure 402 comprising a gate dielectric layer 412 at the bottom and a control gate 414 above it. In the embodiment of the present invention, the gate dielectric layer 412 can be a single dielectric layer, such as a silicon oxide layer. In another embodiment of the present invention, the gate dielectric layer 412 can be a multiple dielectric stacked layer, such as a silicon oxide/silicon nitride/silicon oxide stacked layer. Besides, the material of the control gate 414 can be polycrystalline silicon, doped polycrystalline silicon or other applicable conductive materials, for example.

Further, the charge storage layers 404a and 404b respectively covers a portion of the top and sidewalls of the stacked structure 402, and a gap 416 exists between each of the charge storage layers 404a and 404b. Wherein the material of the charge storage layers 404a and 404b includes polycrystalline silicon or high dielectric constant materials, which can be silicon nitride, aluminum oxide or other applicable material that can be utilized for storing charges, for example.

Further, a dielectric layer 406 is disposed between the top of the stacked structure 402 and each of the charge storage layers 404a and 404b. The dielectric layer 406 can be utilized as an inter gate dielectric layer. The material of the dielectric layer 406 is silicon oxide or other applicable materials, for example.

In addition, a dielectric layer 408 is disposed between the sidewall of the stacked structure 402 and each of the charge storage layers 404a and 404b, and the dielectric layer 408 can be utilized as an isolating spacer. The material of the dielectric layer 408 is silicon oxide or other applicable materials, for example.

Further, a dielectric layer 410 is disposed between each of the charge storage layers 404a and 404b and the substrate 400, and the dielectric layer 410 can be utilized as a tunneling layer. The material of the dielectric layer 410 is silicon oxide or other applicable materials, for example.

Note that in the embodiment, the non-volatile memory of the present invention further includes a pair of assist gates 418a and 418b and a dielectric layer 420. Wherein, the assist gates 418a and 418b are disposed over the substrate 400 on two sides of the pair of charge storage layers 404a and 404b, and separated from each of the charge storage layers 404a and 404b by a gap 422. The material of the assist gates 418a and 418b is polycrystalline silicon or doped polycrystalline silicon, for example. Further, the dielectric layer 420 is disposed between each of the assist gates 418a and 418b and the substrate 400. The material of the dielectric layer 420 is silicon oxide or other applicable materials, for example.

Figure 4B:
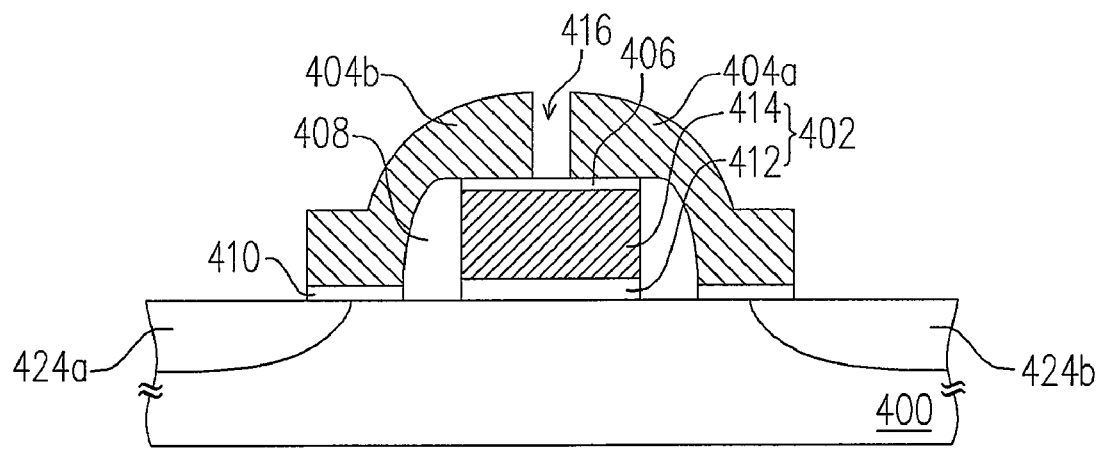
FIG. 4B is a cross-sectional view of a non-volatile memory according to another embodiment of the present invention.

Further, in another embodiment, the non-volatile memory of the present invention, as shown in FIG. 4B, further includes a source region 424a and a drain region 424b. The source region 424a and the drain region 424b are respectively disposed in the substrate 200 on the two sides of the pair of charge storage layers 404a and 404b.

Figure 5A:
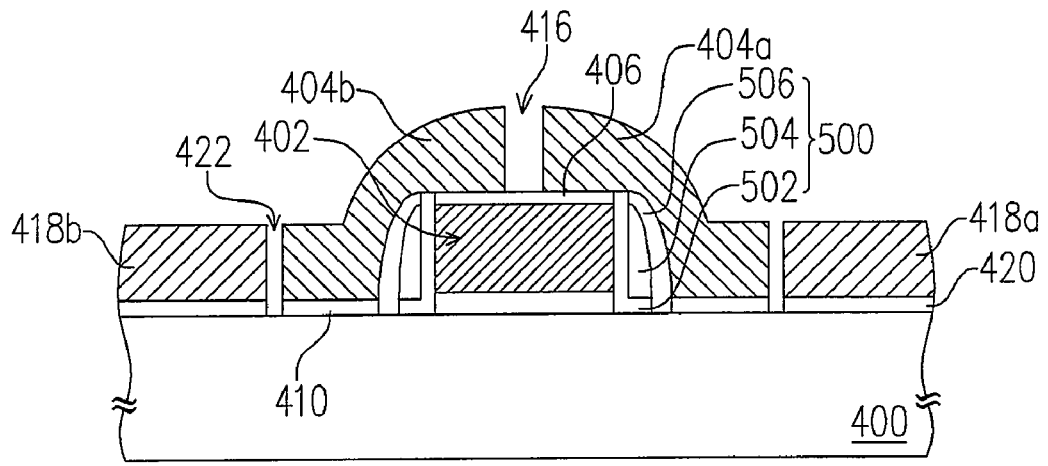
FIG. 5A is a cross-sectional view of a non-volatile memory according to another embodiment of the present invention.
Figure 5B:
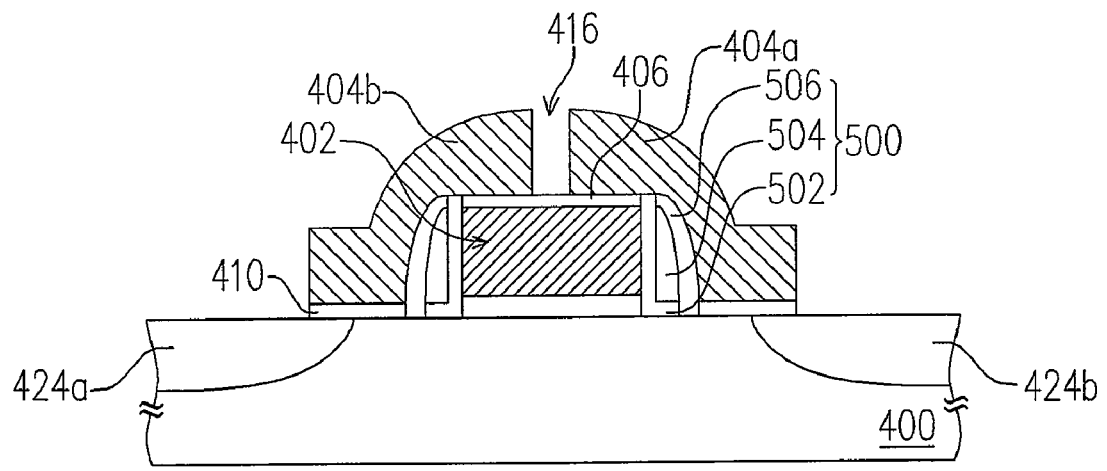
FIG. 5B is a cross-sectional view of a non-volatile memory according to another embodiment of the present invention.
Figure 6A:
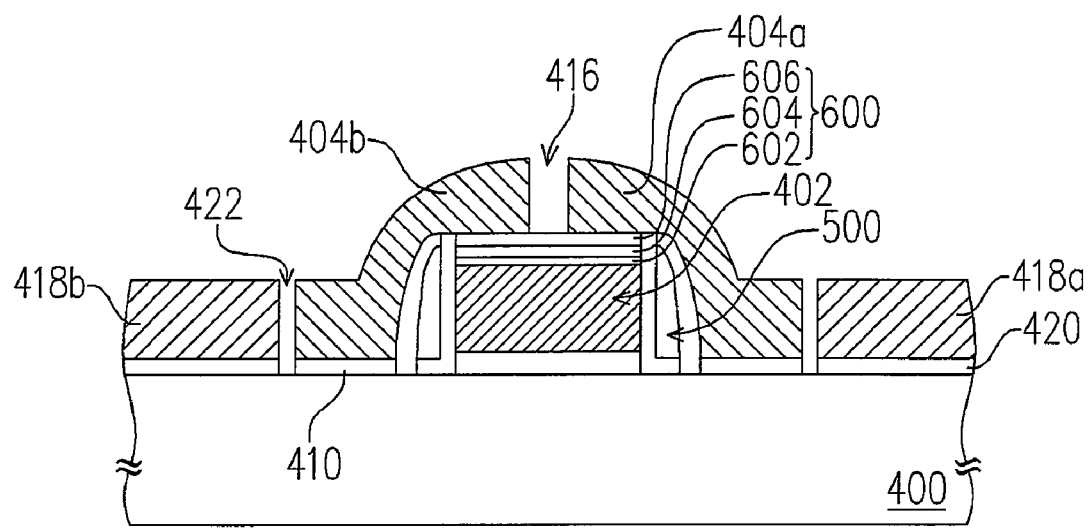
FIG. 6A is a cross-sectional view of a non-volatile memory according to another embodiment of the present invention.
Figure 6B:
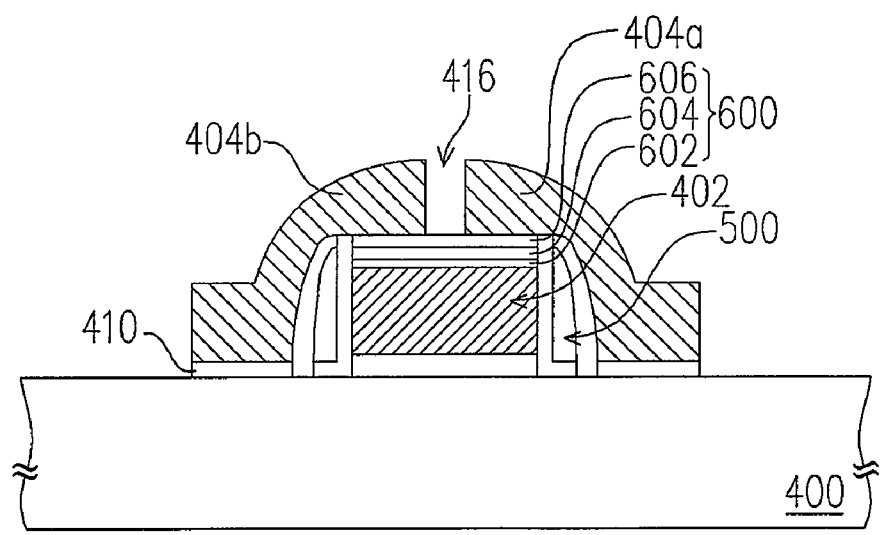
FIG. 6B is a cross-sectional view of a non-volatile memory according to another embodiment of the present invention.

Note that the above-mentioned dielectric layer 408 is not limited to a single dielectric layer, but can also be a multiple dielectric stacked layer 500 shown in FIG. 5A and FIG. 5B. In FIG. 5A and FIG. 5B, the multiple dielectric stacked layer 500 comprises the silicon oxide layer 502/silicon nitride layer 504/silicon oxide layer 506, for example. Besides, in addition to the multiple dielectric stacked layer 500 that can be disposed on the sidewall of the stacked structure 402, multiple dielectric stacked layer 600 can also be disposed on the top of the stacked structure 402 shown in FIG. 6A and FIG. 6B. That is, the dielectric layer 600 shown in FIG. 4A and FIG. 4B is the multiple dielectric stacked layer 600, which comprises the silicon oxide layer 602/silicon nitride layer 604/silicon oxide layer 606, for example.

Because the charge storage layer is disposed over the control gate, the over-erase problem can be solved during the memory erasing process, thereby enhancing the reliability of the element. Further, because the distance between the control gate and the substrate is closer, the voltage required by the control gate can be decreased.

Further, because the assist gate of the present invention can be utilized as a bit line, and a suitable voltage applied on the assist gate can make the substrate underneath turn into a source inversion region or drain region, so that the size of the memory element can be decreased effectively, and the element integration level is therefore increased.

Figure 7A:
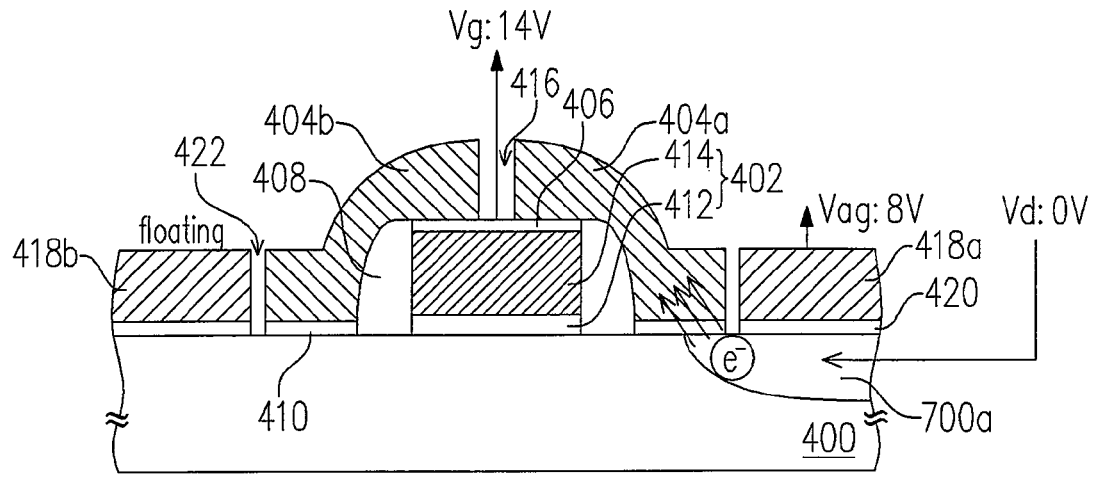
FIGS. 7A and 7B schematically show the non-volatile memory of FIG. 4A during a programming process.

The operation method for a non-volatile memory in FIG. 4A is discussed in the following. As shown in FIG. 7A, when programming a first bit, a control voltage $v_g$ is applied on the control gate 414, a assist voltage $v_{ag}$ is applied on the assist gate 418a for forming a drain inversion region 700a at the substrate 400 below the assist gate 418a; a drain voltage $v_d$ is applied on the drain inversion region 700a, and the assist gate 418b is set as floating state, wherein the voltage values from low to high sequentially are the drain voltage, the assist voltage and the control voltage, so that the electrons go from the drain inversion region 700a into the charge storage layer 404a by a FN tunneling effect. In the embodiment, the control voltage is 14 volts, for example, the assist voltage is 8 volts, for example, and the drain voltage is 0 volt, for example.

Figure 7B:
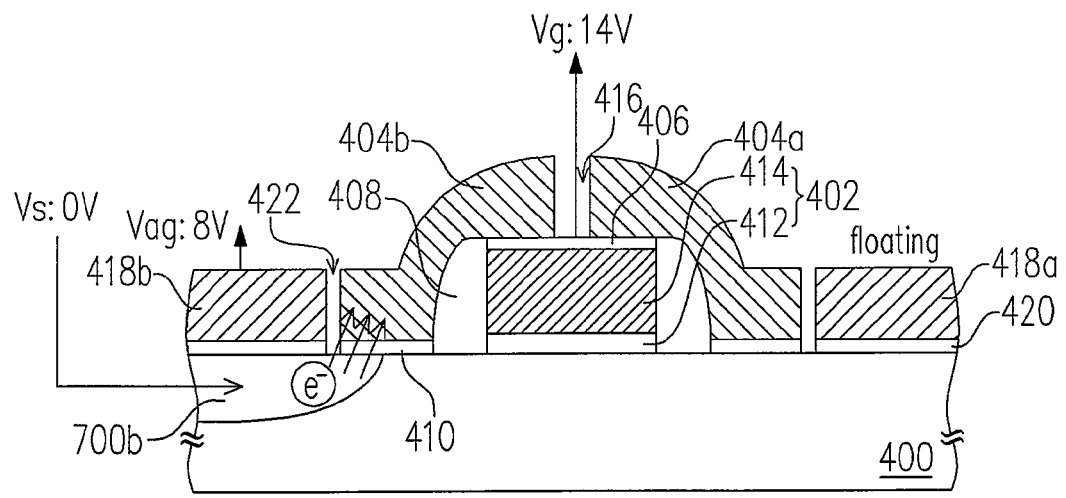

Further, as shown in FIG. 7B, when programming a second bit, the control voltage $v_g$ is applied on the control gate 414, the assist voltage $v_{ag}$ is applied on the assist gate 418b for forming a source inversion region 700b at the substrate 400 below the assist gate 418b; a source voltage $v_s$ is applied on a source inversion region 700b, and the assist gate 418a is set as floating state, wherein the voltage values from low to high sequentially are the source voltage, the assist voltage and the control voltage, so that the electrons go from the source inversion region 700b into the charge storage layer 404b by the FN tunneling effect. In the embodiment, the control voltage is 14 volts, for example, the assist voltage is 8 volts, for example, and the source voltage is 0 volt, for example.

Especially, because the present invention has two charge storage layers 404a and 404b, a bit can be respectively stored in each of the charge storage layers, therefore the memory of the present invention can be utilized as a multi-level memory.

Figure 8A:
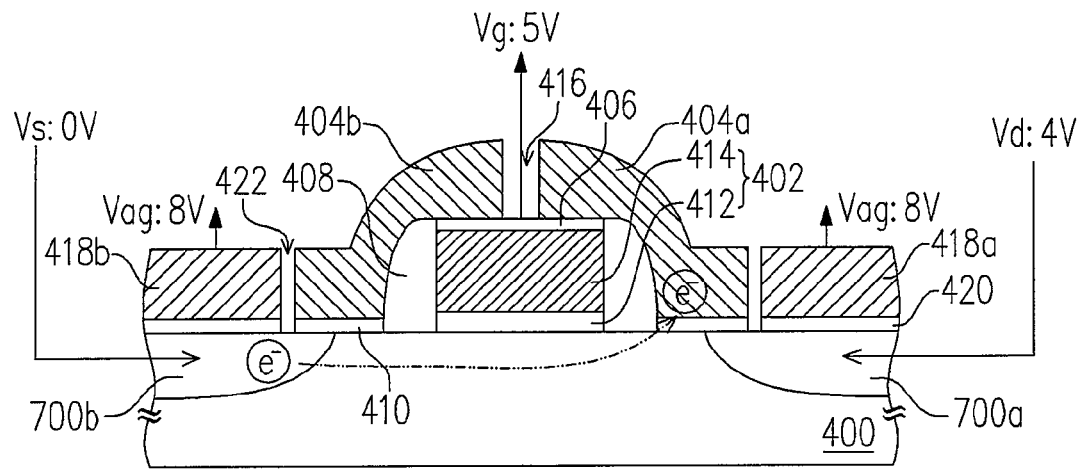
FIGS. 8A and 8B schematically show the non-volatile memory of FIG. 4A during another programming process.

In another embodiment of the present invention as shown in FIG. 8A, when programming a fist bit, a control voltage $v_g$ is applied on the control gate 414, a assist voltage $v_{ag}$ is applied on the assist gates 418a and 418b, for respectively forming a drain inversion region 700a and a source inversion region 700b at the substrate 400 below the assist gates 418a and 418b, a drain voltage $V_d$ is applied on the drain inversion region 700a, a source voltage $v_s$ is applied on the source inversion region 700b, wherein the voltage values from low to high sequentially are the source voltage, the drain voltage, the control voltage and the assist voltage, so that the electrons can go from the source inversion region 700b, through the substrate 400 (channel region) below the control gate 414, into the charge storage layer 404a by a channel hot electron (CHE) effect. In the embodiment, the control voltage is 5 volts, for example, the assist voltage is 8 volts, for example, the drain voltage is 4 volts, for example, and the source voltage is 0 volt, for example.

Figure 8B:
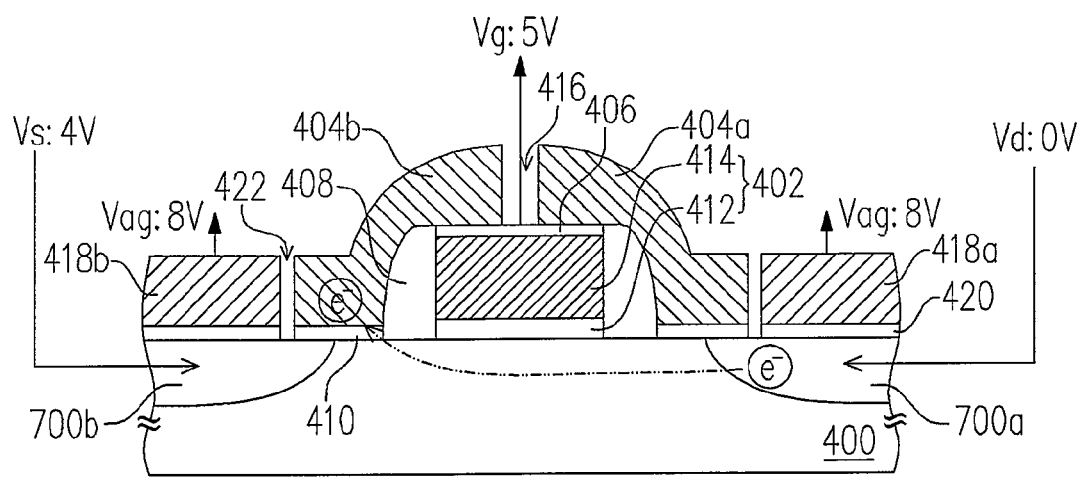

Further, as shown in FIG. 8B, when programming a second bit, the control voltage $v_g$ is applied on the control gate 414, the assist voltage $v_{ag}$ is applied on the assist gates 418a and 418b, for respectively forming a drain inversion region 700a and a source inversion region 700b at the substrate 400 below the assist gates 418a and 418b; the drain voltage $v_d$ is applied on the drain inversion region 700a, the source voltage $v_s$ is applied on the source inversion region 700b, wherein the voltage values from low to high sequentially are the drain voltage, the source voltage, the control voltage and the assist voltage, so that the electrons can go from the drain inversion region 700a, through the substrate 400 (channel region) below the control gate 414, into the charge storage layer 404b by the channel hot electron (CHE) effect. In the embodiment, the control voltage is 5 volts, for example, the assist voltage is 8 volts, for example, the source voltage is 4 volts, for example and the drain voltage is 0 volt, for example.

Figure 9A:
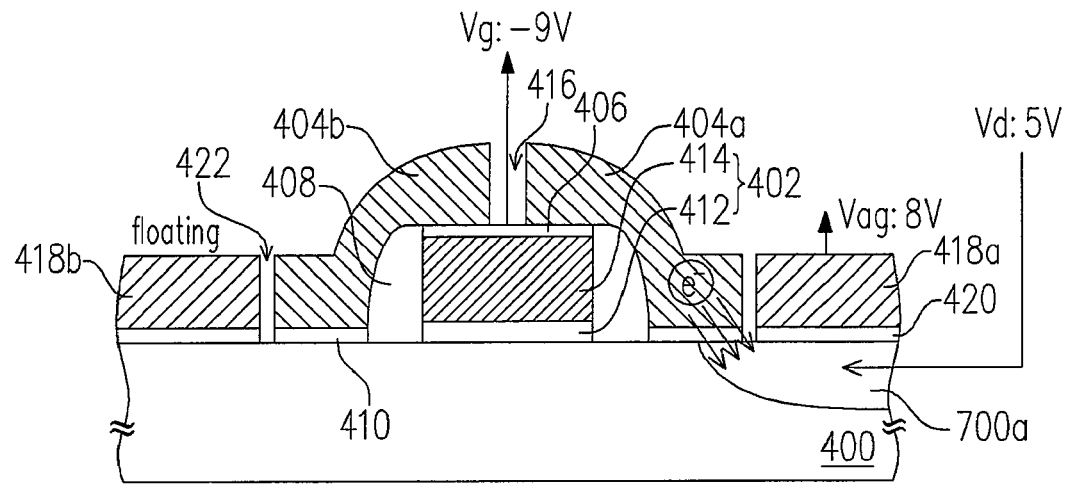
FIGS. 9A and 9B schematically show the non-volatile memory of FIG. 4A during an erasing process.

Further, as shown in FIG. 9A, when erasing a first bit, a control voltage $v_g$ is applied on the control gate 414, a assist voltage $v_{ag}$ is applied on the assist gate 418a, for forming a drain inversion region 700a at the substrate 400 below the assist gate 418a, a drain voltage $v_d$ is applied on the drain inversion region 700a, and the assist gate 418b is set as floating state, wherein the voltage values from low to high sequentially are the drain voltage, the assist voltage and the control voltage, so that the electrons can go from the charge storage layer 404a into the drain inversion region 700a by the FN tunneling effect. In the embodiment, the control voltage is −9 volts, for example, the assist voltage is 8 volts, for example and the drain voltage is 5 volts, for example.

Figure 9B:
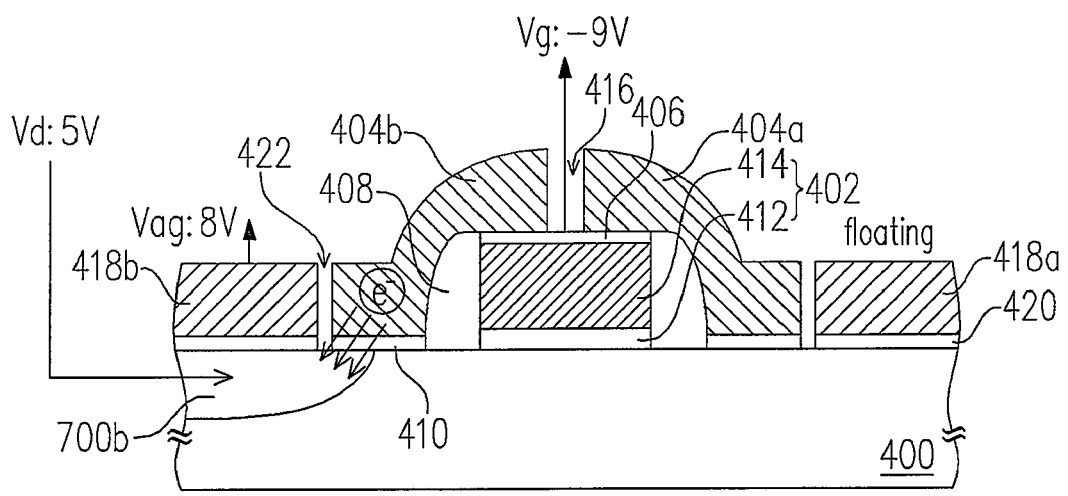

Further, as shown in FIG. 9B, when erasing a second bit, the control voltage $v_g$ is applied on the control gate 414, the assist voltage $v_{ag}$ is applied on the assist gate 418b for forming a source inversion region 700b at the substrate 400 below the assist gate 418b, the source voltage $v_s$ is applied on the source inversion region 700b, and the assist gate 418a is set as floating state, wherein the voltage values from low to high sequentially are the source voltage, the assist voltage and the control voltage, so that the electrons can go from the charge storage layer 404b into the source inversion region 700b by the FN tunneling effect. In the embodiment, the control voltage is −9 volts, for example, the assist voltage is 8 volts, for example and the source voltage is 5 volts, for example.

Especially, because the charge storage layers 404a and 404b are disposed over the control gate 414, the over-erase problem can be solved during the memory erasing process, thereby enhancing the reliability of the element.

Figure 10A:
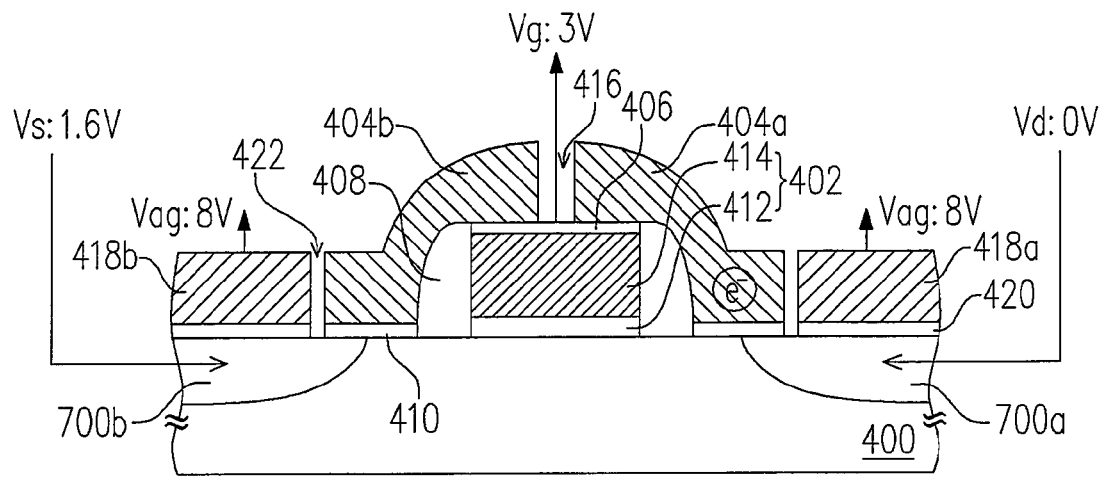
FIGS. 10A and 10B schematically show the non-volatile memory of FIG. 4A during a reading process.

Further, as shown in FIG. 10A, when reading a first bit, a control voltage $v_g$ is applied on the control gate 414, a assist voltage $V_{ag}$ is applied on the assist gates 418a and 418b, for respectively forming a drain inversion region 700a and a source inversion region 700b at the substrate 400 below the assist gates 418a and 418b, a source voltage $v_s$ is applied on the source inversion region 700b, a drain voltage $v_d$ is applied on the drain inversion region 700a, wherein the voltage values from low to high sequentially are the drain voltage, the source voltage, the control voltage and the assist voltage, for reading the bit stored in the charge storage layer 404a. In the embodiment, the control voltage is 3 volts, for example, the assist voltage is 8 volts, for example, the drain voltage is 0 volt, for example and the source voltage is 1.6 volts, for example.

Figure 10B:
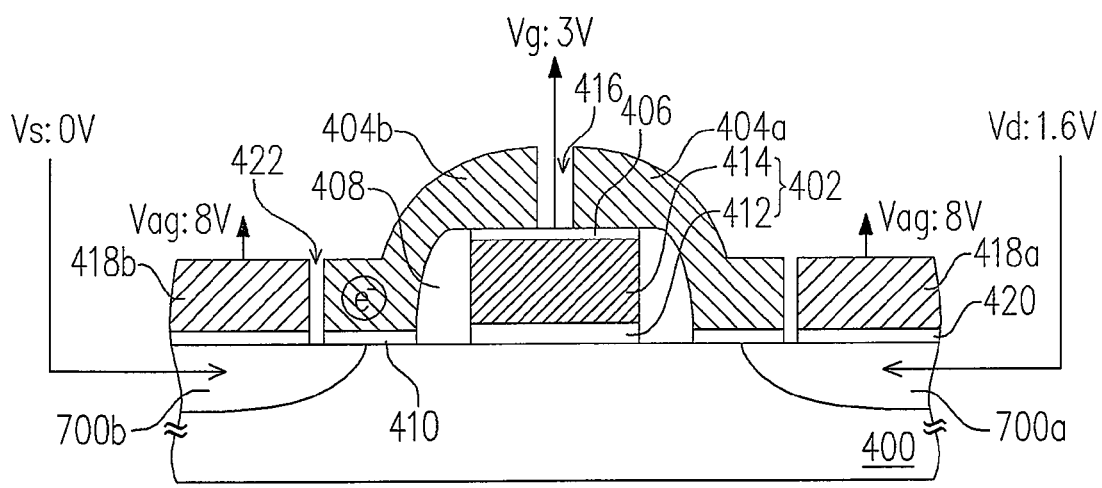

Further, as shown in FIG. 10B, when reading a second bit, the control voltage $v_g$ is applied on the control gate 414, the assist voltage $v_{ag}$ is applied on the assist gates 418a and 418b, for respectively forming a drain inversion region 700a and a source inversion region 700b at the substrate 400 below the assist gates 418a and 418b, the source voltage $v_s$ is applied on the source inversion region 700b, the drain voltage $v_d$ is applied on the drain inversion region 700a, wherein the voltage values from low to high sequentially are the source voltage, the drain voltage, the control voltage and the assist voltage, for reading the bit stored in the charge storage layer 404b. In the embodiment, the control voltage is 3 volts, for example, the assist voltage is 8 volts, for example, the source voltage is 0 volt, for example, and the drain voltage is 1.6 volts, for example.

Figure 11A:
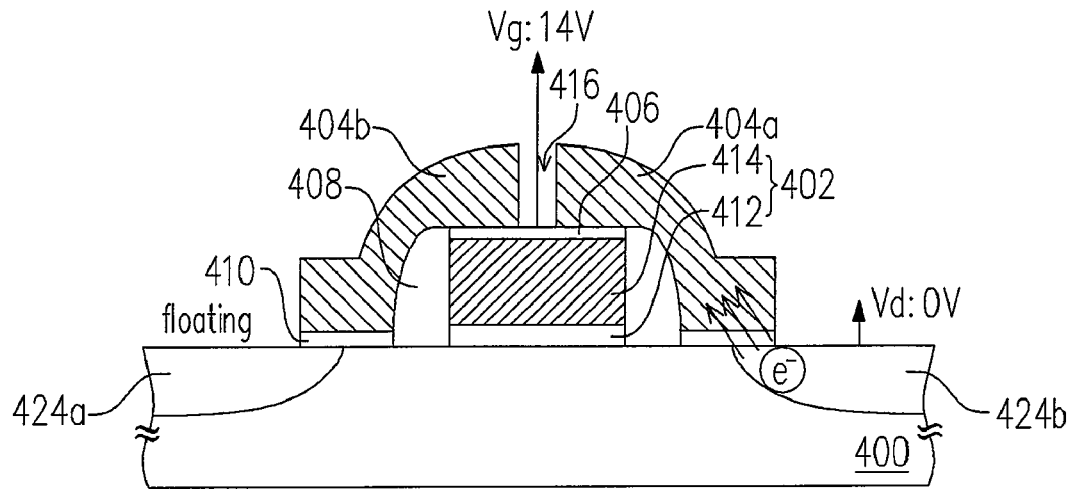
FIGS. 11A and 11B schematically show the non-volatile memory of FIG. 4B during a programming process.

The operation method for a non-volatile memory in FIG. 4B is discussed in the following. As shown in FIG. 11A, when programming a first bit, a control voltage $v_g$ is applied on the control gate 414, a drain voltage $v_d$ is applied on the drain region 424b, and the source region 424a is set as floating state, wherein the voltage values from low to high sequentially are the drain voltage and the control voltage, so that the electrons can go from the drain region 424b into the charge storage layer 404a by a FN tunneling effect. In the embodiment, the control voltage is 14 volts, for example, and the drain voltage is 0 volt, for example.

Figure 11B:
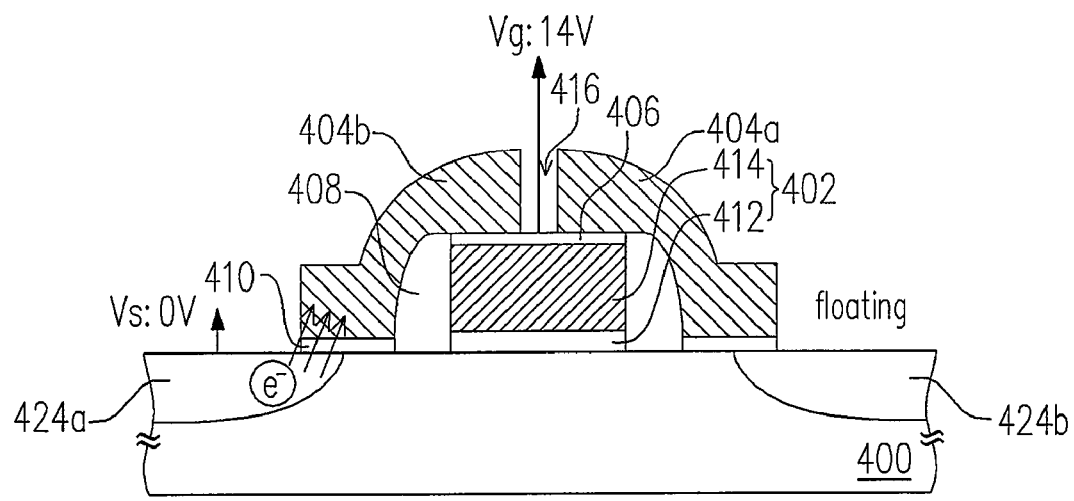

Further, as shown in FIG. 11B, when programming a second bit, the control voltage $v_g$ is applied on the control gate 414, the source voltage $v_s$ is applied on the source region 424a, and the drain region 424b is set as floating state, wherein the voltage values from low to high sequentially are the source voltage and the control voltage, so that the electrons can go from the source region 424a into the charge storage layer 404b by the FN tunneling effect. In the embodiment, the control voltage is 14 volts, for example, and the source voltage is 0 volt, for example.

Especially, because the present invention has two charge storage layers 404a and 404b, a bit can be respectively stored in each of the charge storage layers, therefore the memory of the present invention can be utilized as a multi-level memory.

Figure 12A:
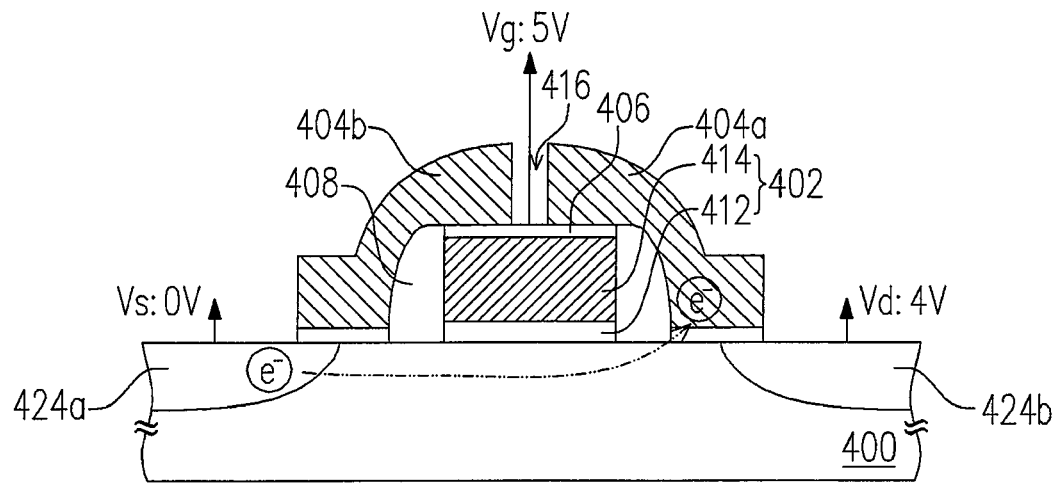
FIGS. 12A and 12B schematically show the non-volatile memory of FIG. 4B during another programming process.

In another embodiment of the present invention as shown in FIG. 12A, when programming a first bit, a control voltage $v_g$ is applied on the control gate 414; a drain voltage $v_d$ is applied on the drain regions 424b; a source voltage $v_s$ is applied on the source regions 424a, wherein the voltage values from low to high sequentially are the source voltage, the drain voltage and the control voltage, so that the electrons can go from the source region 424a, through the substrate 400 (channel region) below the control gate 414, into the charge storage layer 404a by a channel hot electron (CHE) effect. In the embodiment, the control voltage is 5 volts, for example, the drain voltage is 4 volts, for example and the source voltage is 0 volt, for example.

Figure 12B:
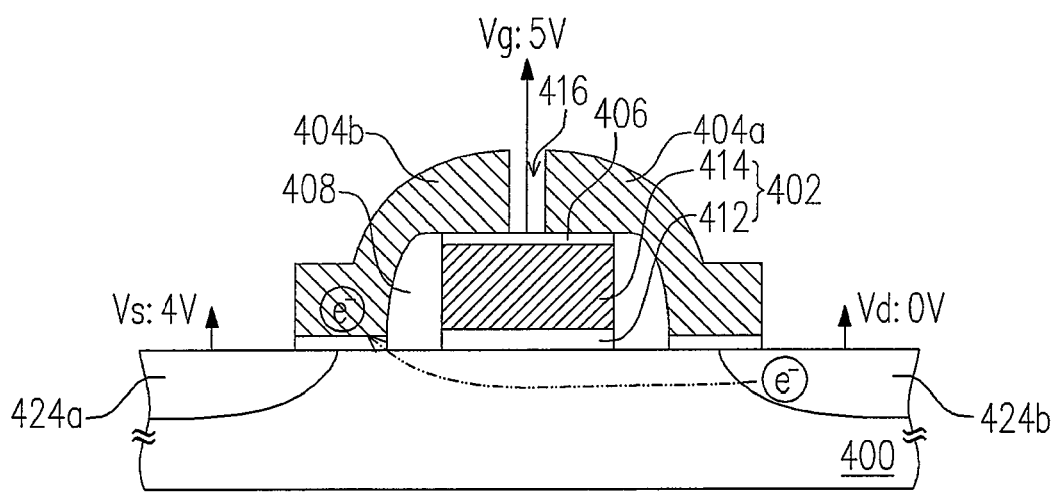

Further, as shown in FIG. 12B, when programming a second bit, the control voltage $v_g$ is applied on the control gate 414; the drain voltage $v_d$ is applied on the drain regions 424b; the source voltage $v_s$ is applied on the source regions 424a, wherein the voltage values from low to high sequentially are the drain voltage, the source voltage and the control voltage, so that the electrons can go from the drain region 424b, through the substrate 400 (channel region) below the control gate 414, into the charge storage layer 404b by the channel hot electron (CHE) effect. In the embodiment, the control voltage is 5 volts, for example, the source voltage is 4 volts, for example and the drain voltage is 0 volt, for example.

Figure 13A:
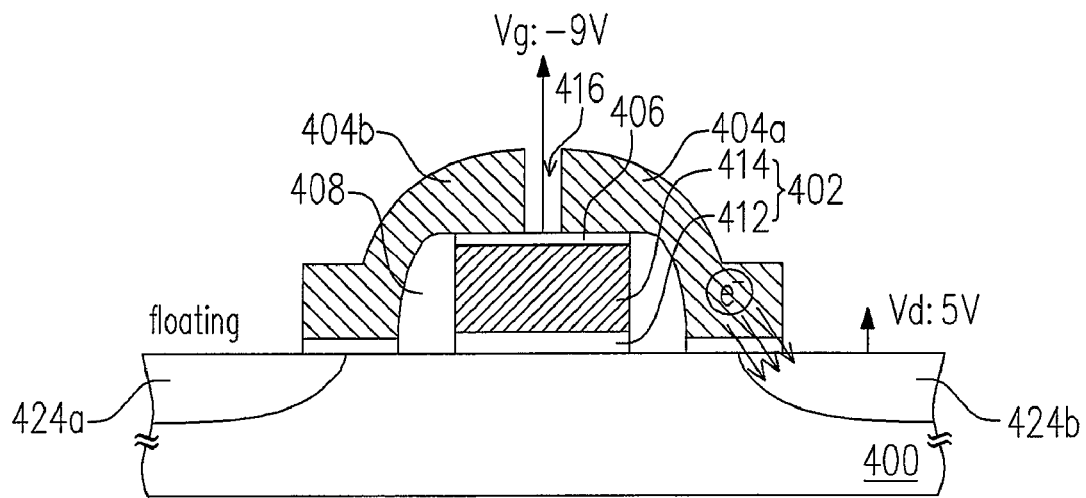
FIGS. 13A and 13B schematically show the non-volatile memory of FIG. 4B during an erasing process.

Further, as shown in FIG. 13A, when erasing a first bit, a control voltage $v_g$ is applied on the control gate 414; a drain voltage $v_d$ is applied on the drain regions 424b; and the source region 424a is set as floating state, wherein the voltage values from low to high sequentially are the drain voltage and the control voltage, so that the electrons can go from the charge storage layer 404a into the drain region 424b by the FN tunneling effect. In the embodiment, the control voltage is −9 volts, for example, and the drain voltage is 5 volts, for example.

Figure 13B:
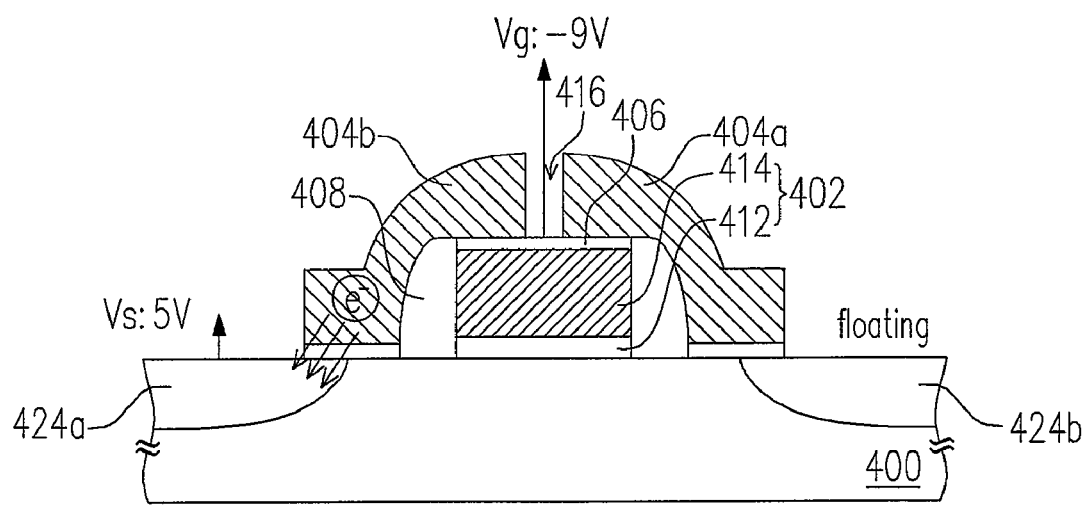

Further, as shown in FIG. 13B, when erasing a second bit, the control voltage $v_g$ is applied on the control gate 414; the source voltage $v_s$ is applied on the source region 424a; and the drain region 424b is set as floating state, wherein the voltage values from low to high sequentially are the source voltage and the control voltage, so that the electrons can go from the charge storage layer 404b into the source region 424a by the FN tunneling effect. In the embodiment, the control voltage is −9 volts, for example, and the source voltage is 5 volts, for example.

Especially, because the charge storage layers 404a and 404b are disposed over the control gate 414, the over-erase problem during the memory erasing process can be resolved, thus enhancing the reliability of the element.

Figure 14A:
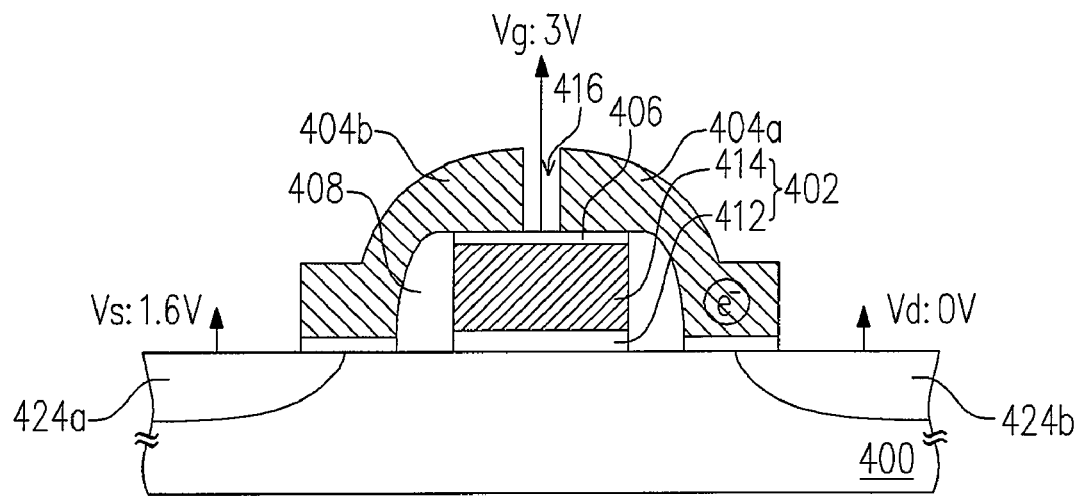
FIGS. 14A and 14B schematically show the non-volatile memory of FIG. 4B during a reading process.

Further, as shown in FIG. 14A, when reading a first bit, a control voltage $v_g$ is applied on the control gate 414; a source voltage $v_s$ is applied on the source region 424a; a drain voltage $v_d$ is applied on the drain region 424b, wherein the voltage values from low to high sequentially are the drain voltage, the source voltage and the control voltage, for reading the bit stored in the charge storage layer 404a. In the embodiment, the control voltage is 3 volts, for example, the drain voltage is 0 volt, for example and the source voltage is 1.6 volts, for example.

Figure 14B:
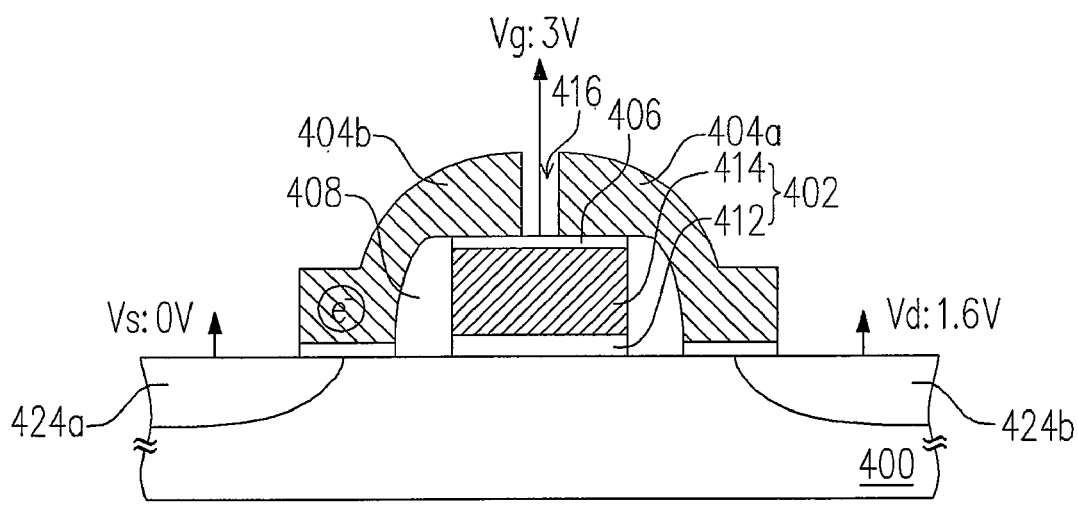

Further, as shown in FIG. 14B, when reading a second bit, the control voltage $v_g$ is applied on the control gate 414; the source voltage $v_s$ is applied on the source region 424a; the drain voltage $v_d$ is applied on the drain region 424b, wherein the voltage values from low to high sequentially are the source voltage, the drain voltage and the control voltage, for reading the bit stored in the charge storage layer 404b. In the embodiment, the control voltage is 3 volts, for example, the source voltage is 0 volt, for example and the drain voltage is 1.6 volts, for example.

In summary, the present invention has at least the following advantages:

1. Because the charge storage layer is disposed over the control gate, the over-erase problem during the memory erasing process can be resolved, thereby enhancing the reliability of the element.

2. Because the present invention has two charge storage layers which are separated from each other, a bit can be respectively stored at each of the charge storage layers, therefore the memory of the present invention can be utilized as a multi-level memory.

3. Because the assist gate of the present invention can be utilized as a bit line, and a suitable voltage applied on the assist gate can cause the substrate underneath turn into a source inversion region or drain region, so that the size of the memory element can be decreased effectively, and the element integration level is therefore increased.

4. Because the distance between the control gate and the substrate is closer in the present invention, the voltage required by the control gate can be decreased.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A non-volatile memory fabrication method, comprising:
   forming a stacked structure on a substrate, wherein the stacked structure comprises a gate dielectric layer at the bottom and a control gate above it;
   forming a first dielectric layer on the top of the control gate wherein the first dielectric layer covers and contacts the entire top of the control gate and has stacked layer of bottom oxide, nitride, and top oxide layers;
   forming a second dielectric layer and a third dielectric layer respectively on sidewalls of the stacked structure and over an exposed substrate; and
   forming a pair of conductive charge storage layers over the substrate respectively covering a portion of the top and the sidewalls of the stacked structure, wherein a first gap exists between each of the charge storage layers, wherein the conductive charge storage layers are controlled by the control gate of the stacked structure.

2. The non-volatile memory fabrication method of claim 1, wherein when forming the pair of conductive charge storage layers, the method further comprises forming a pair of assist gates over the substrate on two sides of the pair of charge storage layers, wherein a second gap exists between each of the assist gates and each of the poly charge storage layers.

3. The non-volatile memory fabrication method of claim 1, further comprising a step of forming a source region and a drain region in the substrate on the two sides of the pair of conductive charge storage layers after forming the pair of conductive charge storage layers.

4. The non-volatile memory fabrication method of claim 1, wherein the material of the conductive charge storage layers comprises polycrystalline silicon.

5. The non-volatile memory fabrication method of claim 1, wherein the gate dielectric layer, the first dielectric layer and the second dielectric layer are single dielectric layers or a multiple dielectric stacked layer.

* * * * *